United States Patent
Sigle

(10) Patent No.: US 9,307,640 B2
(45) Date of Patent: Apr. 5, 2016

(54) PCB PAD FOR IMAGER OF VEHICLE VISION SYSTEM

(71) Applicant: MAGNA ELECTRONICS INC., Auburn Hills, MI (US)

(72) Inventor: Marc Sigle, Alzenau (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 151 days.

(21) Appl. No.: 14/082,574

(22) Filed: Nov. 18, 2013

(65) Prior Publication Data

US 2014/0138140 A1    May 22, 2014

Related U.S. Application Data

(60) Provisional application No. 61/727,911, filed on Nov. 19, 2012.

(51) Int. Cl.
*H05K 1/11* (2006.01)

(52) U.S. Cl.
CPC ...... *H05K 1/111* (2013.01); *H05K 2201/09381* (2013.01); *H05K 2201/09418* (2013.01); *Y02P 70/611* (2015.11)

(58) Field of Classification Search
CPC ........................................ H05K 1/111
USPC ........................................ 174/261
See application file for complete search history.

(56) References Cited

U.S. PATENT DOCUMENTS

| | | | |
|---|---|---|---|
| 5,550,677 A | 8/1996 | Schofield et al. | |
| 5,670,935 A | 9/1997 | Schofield et al. | |
| 5,760,962 A | 6/1998 | Schofield et al. | |
| 5,786,772 A | 7/1998 | Schofield et al. | |
| 5,796,094 A | 8/1998 | Schofield et al. | |
| 5,877,897 A | 3/1999 | Schofield et al. | |
| 5,929,786 A | 7/1999 | Schofield et al. | |
| 5,949,331 A | 9/1999 | Schofield et al. | |
| 6,201,642 B1 | 3/2001 | Bos | |
| 6,302,545 B1 | 10/2001 | Schofield et al. | |
| 6,396,397 B1 | 5/2002 | Bos et al. | |
| 6,498,620 B2 | 12/2002 | Schofield et al. | |
| 6,523,964 B2 | 2/2003 | Schofield et al. | |
| 6,611,202 B2 | 8/2003 | Schofield et al. | |
| 6,690,268 B2 | 2/2004 | Schofield et al. | |
| 6,802,617 B2 | 10/2004 | Schofield et al. | |
| 6,806,452 B2 | 10/2004 | Bos et al. | |
| 6,822,563 B2 | 11/2004 | Bos et al. | |
| 6,882,287 B2 | 4/2005 | Schofield | |

(Continued)

*Primary Examiner* — Timothy Thompson
*Assistant Examiner* — Charles Pizzuto
(74) *Attorney, Agent, or Firm* — Gardner, Linn, Burkhart & Flory, LLP

(57) ABSTRACT

A circuit board for an image processing chip of a vision system of a vehicle is configured for a surface mount device to be attached thereto and includes at least one mounting location having a plurality of solder pads established thereat. The pads are arranged in a manner that enhances soldering of the device or component to the pad and circuit board. The pads may be arranged similarly in respective portions of the mounting location, such that the pads of one portion of the mounting location may be generally parallel to one another and may be generally orthogonal to the pads of another portion of the mounting location. Optionally, the pads may be generally tear-drop shaped, and the tear-drop shaped pads may be arranged so as to point generally towards or generally away from a center area of the mounting location of the circuit board.

20 Claims, 2 Drawing Sheets

(56) References Cited

U.S. PATENT DOCUMENTS

| | | |
|---|---|---|
| 6,891,563 B2 | 5/2005 | Schofield et al. |
| 6,946,978 B2 | 9/2005 | Schofield |
| 6,998,861 B2 * | 2/2006 | Nakai et al. .................. 361/767 |
| 7,005,974 B2 | 2/2006 | McMahon et al. |
| 7,038,577 B2 | 5/2006 | Pawlicki et al. |
| 7,161,616 B1 | 1/2007 | Okamoto et al. |
| 7,592,928 B2 | 9/2009 | Chinomi et al. |
| 7,720,580 B2 | 5/2010 | Higgins-Luthman |
| 7,855,755 B2 | 12/2010 | Weller et al. |
| 7,859,565 B2 | 12/2010 | Schofield et al. |
| 7,881,496 B2 | 2/2011 | Camilleri et al. |
| 8,203,418 B2 * | 6/2012 | Harrison et al. .............. 336/200 |
| 2009/0101397 A1 * | 4/2009 | Kuo et al. ..................... 174/260 |
| 2014/0313339 A1 | 10/2014 | Diessner |
| 2014/0340510 A1 | 11/2014 | Ihlenburg |

* cited by examiner

PCB PAD FOR IMAGER OF VEHICLE VISION SYSTEM

CROSS REFERENCE TO RELATED APPLICATION

The present application claims the filing benefits of U.S. provisional application Ser. No. 61/727,911, filed Nov. 19, 2012, which is hereby incorporated herein by reference in its entirety.

FIELD OF THE INVENTION

The present invention relates to vehicles with cameras mounted thereon and in particular to vehicles with exterior-facing cameras, such as forward facing cameras and/or sideward facing cameras and/or rearward facing cameras.

BACKGROUND OF THE INVENTION

Use of imaging sensors in vehicle imaging systems is common and known. Examples of such known systems are described in U.S. Pat. Nos. 5,949,331; 5,670,935; and/or 5,550,677, which are hereby incorporated herein by reference in their entireties. Surface mount device (SMD) printed circuit board (PCB) pads are known and examples of known pads are shown in FIGS. 1 and 2. A concern with such known pads is that the positioning of SMD chips with several legs or solder pads is not always accurate. The self alignment during soldering is not fully sufficient when using the known soldering pad designs shown in FIGS. 1 and 2.

SUMMARY OF THE INVENTION

The present invention provides a vision system that utilizes one or more cameras or image sensors to capture image data of a scene exterior (such as forwardly) of a vehicle and provides a display of images indicative of or representative of the captured image data. The imager or camera includes a circuit board at which one or more components and/or circuitry is/are established. The circuit board for a surface mount device to be attached thereto includes at least one mounting location having a plurality of pads established thereat. The pads are arranged in a manner that enhances soldering of the component to the pad and circuit board.

For example, the pads may be arranged similarly in respective portions of the mounting location, with the pads of one portion of the mounting location being generally orthogonal to the pads of another portion of the mounting location. Optionally, the pads may comprise generally tear-drop shaped pads. Optionally, the tear-drop shaped pads may be arranged so as to point generally towards or generally away from a center area of the mounting location of the circuit board.

These and other objects, advantages, purposes and features of the present invention will become apparent upon review of the following specification in conjunction with the drawings.

DETAILED DESCRIPTION OF THE INVENTION

Figure 3:
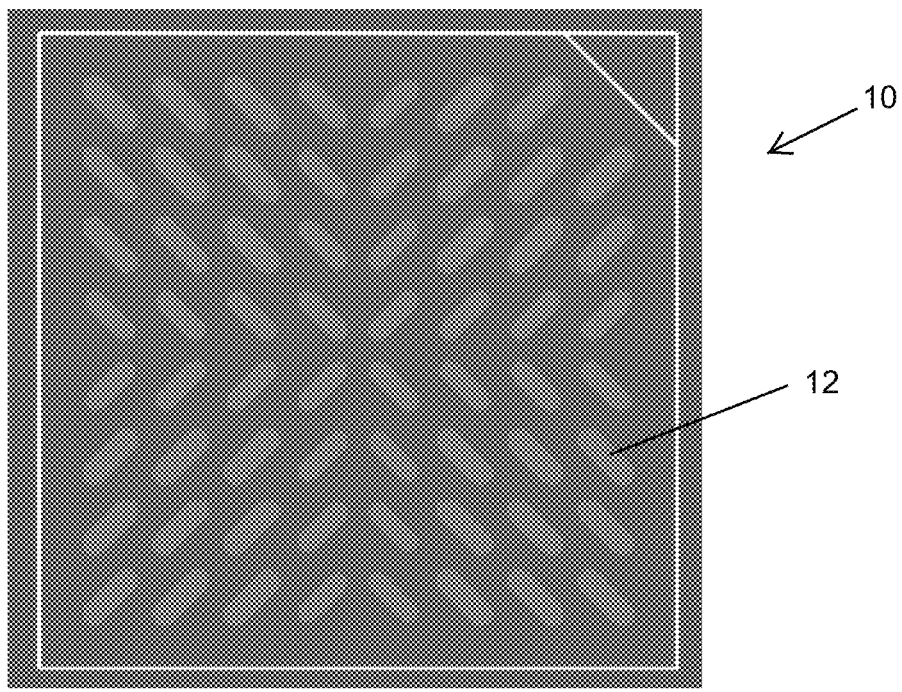
FIG. 3 is a plan view of a PCB and solder pad arrangement in accordance with the present invention.
Figure 4:
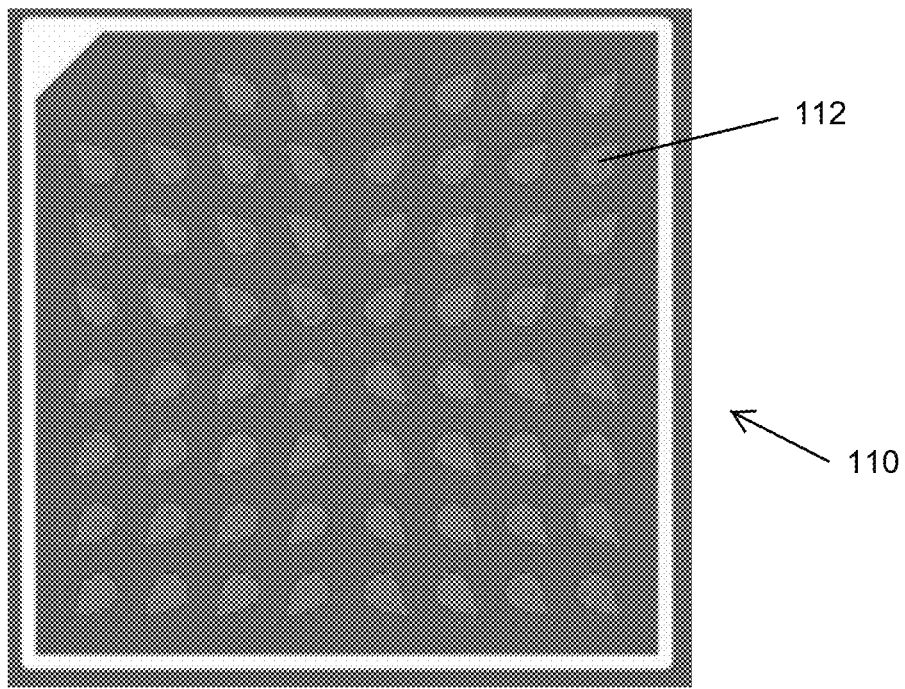
FIG. 4 is a plan view of another PCB and solder pad arrangement in accordance with the present invention.

Surface mount devices (SMD) printed circuit board (PCB) solder pads of the present invention are shown in FIGS. 3 and 4 and have special designs that are meant to control the spread direction and the surface tension force direction for having a well moisting drop of solder when heating up the solder in the reflow oven. A SMD component centers between two soldering pads (in a way that the surface tension of both solder points is minimal).

Figure 1:
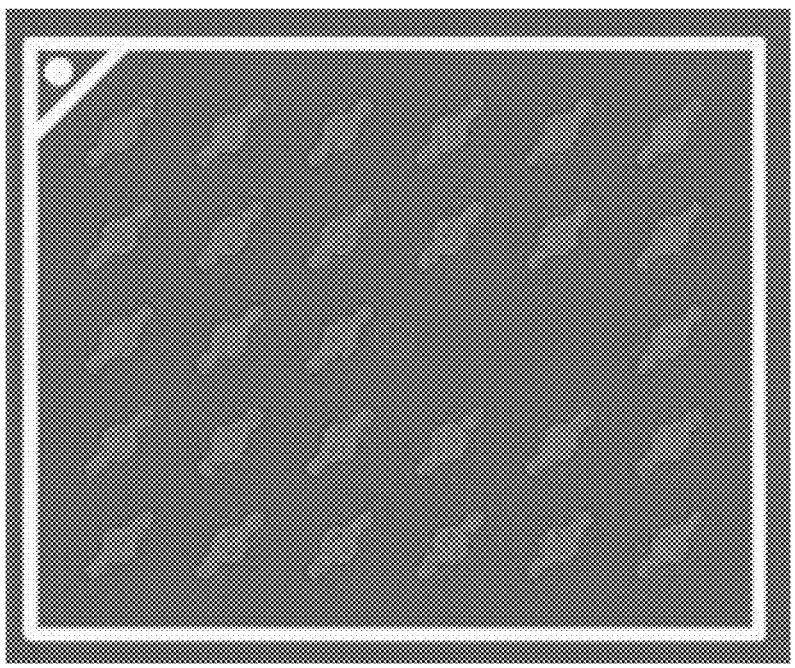
FIGS. 1 and 2 are plan views of typical printed circuit board (PCB) solder pads.
Figure 2:
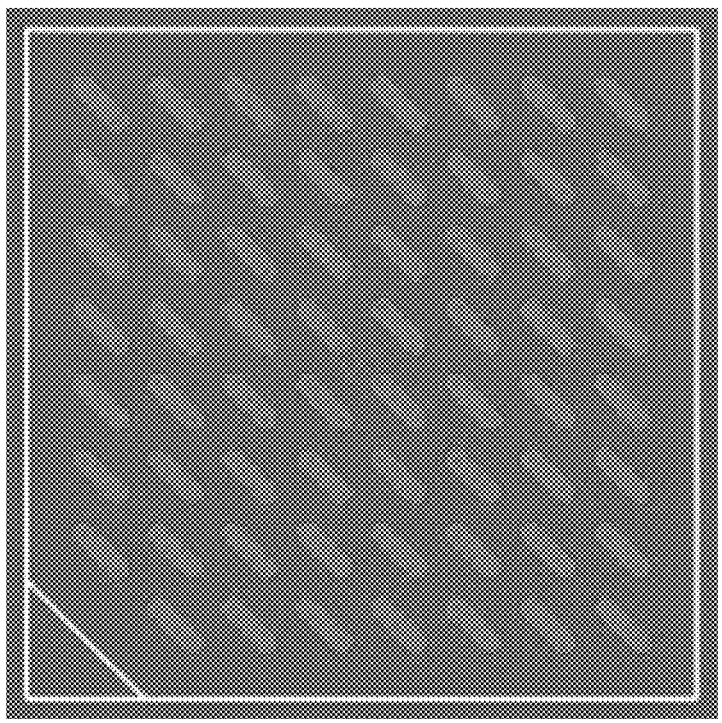

The new pad design of the present invention achieves better self adjustment results in turning and positioning alignment due to the tension forces. As shown in FIGS. 3 and 4, the pads 12, 112 of the printed circuit boards 10, 110 are configured and arranged in a non-aligned or non-parallel manner (unlike known solder pad configurations of FIGS. 1 and 2). The printed circuit board or chip of the present invention comprises an image processor chip for an image processor of a vehicle vision system that is operable to process image data captured by one or more cameras of the vehicle. As shown in FIG. 3, the elongated solder pads 12, and as shown in FIG. 4, the teardrop-shaped solder pads 112, are pointing mostly concentrically away from the center. These have now two dimensions. The tension forces act orthogonal to the direction a solder point is stretched. By that, a force concentrically around the center of the mounting location for turning can also be achieved (until the component is aligned).

The examples of FIGS. 3 and 4 show squared components or mounting locations of a PCB. The center the teardrop's pointings (FIG. 4), or in other words the center of the mounting location, may be identical or substantially identical to the components' centers. By that, rectangle, round or triangular or otherwise shape components may be aligned and attached at the solder pads at the mounting location of the PCB. The pads of the present invention comprise elongated solder pads each having a longitudinal axis, with the solder pads arranged at the circuit board such that the longitudinal axes of some of the solder pads are generally orthogonal to the longitudinal axes of others of the solder pads. For example, the longitudinal axes of pads of a particular quadrant of the mounting location may be parallel to one another and generally orthogonal to the longitudinal axes of pads of another quadrant of the mounting location.

Thus, the present invention provides solder pads for a surface mount device at a printed circuit board, where the pads are arranged in a manner that enhances soldering of the component to the pad and circuit board. The pads may be arranged so that pads located in each quadrant or quarter or portion of the mounting location are arranged generally parallel to or aligned with the pads of that quadrant or quarter or portion, while the pads of different quadrants or quarters or portions are non-parallel or non-aligned. For example, the pads of opposite quadrants may be generally aligned with one another, while the pads of the other quadrants may be generally aligned with one another and generally orthogonal to the pads of the first quadrants. For example, and as shown in FIG. 3, the solder pads of a first quadrant at an upper left corner of the mounting location or area are orthogonal to the solder pads of a second quadrant at the upper right corner of the mounting location or area, and the solder pads of the first quadrant are generally parallel to the solder pads of a third quadrant at the lower right corner of the mounting location or area and the solder pads of the second quadrant are generally parallel to the solder pads of a fourth quadrant at the lower left corner of the mounting location or area.

The solder pads may be arranged similarly in respective portions of the mounting location. For example, the solder pads of one portion of the mounting location may be generally orthogonal to the solder pads of another portion of the mounting location (and may be generally parallel to solder pads of a third portion of the mounting location).

Optionally, the pads may be tear drop shaped and may be arranged so as to point generally towards or generally away from the center of the mounting location at the circuit board. Optionally, the solder pads may each comprise a narrower end and a wider end, and the solder pads may be arranged so as to point generally towards or generally away from a center area of the mounting location of the circuit board. Optionally, and such as shown in FIG. 3, the solder pads may each comprise an elongated solder pad having a longitudinal axis, and the solder pads may be arranged such that the longitudinal axes of some of the solder pads are generally orthogonal to the longitudinal axes of others of the solder pads.

The SMD PCB pads of the present invention may be suitable for use with any type of sensor or sensors for a vehicle system or vision system, such as imaging sensors or radar sensors or lidar sensors or ultrasonic sensors or the like.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in PCT Application No. PCT/US2012/066570, filed Nov. 27, 2012, and/or PCT Application No. PCT/US2012/066571, filed Nov. 27, 2012, which are hereby incorporated herein by reference in their entireties.

The system includes an image processor or processor chip operable to process image data captured by the camera or cameras, such as for detecting objects or other vehicles or pedestrians or the like in the field of view of one or more of the cameras. For example, the image processor may comprise an EyeQ2 or EyeQ3 image processing chip available from Mobileye Vision Technologies Ltd. of Jerusalem, Israel, and may include object detection software (such as the types described in U.S. Pat. Nos. 7,855,755; 7,720,580; and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The imaging sensor or camera may capture image data for image processing and may comprise any suitable camera or sensing device, such as, for example, an array of a plurality of photosensor elements arranged in at least 640 columns and 480 rows (preferably a megapixel imaging array or the like), with a respective lens focusing images onto respective portions of the array. The photosensor array may comprise a plurality of photosensor elements arranged in a photosensor array having rows and columns. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or International Publication Nos. WO 2011/028686; WO 2010/099416; WO 2012/061567; WO 2012/068331; WO 2012/075250; WO 2012/103193; WO 2012/0116043; WO 2012/0145313; WO 2012/0145501; WO 2012/145818; WO 2012/145822; WO 2012/158167; WO 2012/075250; WO 2012/103193; WO 2012/0116043; WO 2012/0145501; WO 2012/0145343; WO 2012/154919; WO 2013/019707; WO 2013/016409; WO 2012/145822; WO 2013/067083; WO 2013/070539; WO 2013/043661; WO 2013/048994; WO 2013/063014, WO 2013/081984; WO 2013/081985; WO 2013/074604; WO 2013/086249; WO 2013/103548; WO 2013/109869; WO 2013/123161; WO 2013/126715; WO 2013/043661 and/or WO 2013/158592 and/or U.S. patent application Ser. No. 14/052,945, filed Oct. 14, 2013; Ser. No. 14/046,174, filed Oct. 4, 2013; Ser. No. 14/016,790, filed Oct. 3, 2013; Ser. No. 14/036,723, filed Sep. 25, 2013; Ser. No. 14/016,790, filed Sep. 3, 2013; Ser. No. 14/001,272, filed Aug. 23, 2013; Ser. No. 13/970,868, filed Aug. 20, 2013; Ser. No. 13/964,134, filed Aug. 12, 2013; Ser. No. 13/942,758, filed Jul. 16, 2013; Ser. No. 13/942,753, filed Jul. 16, 2013; Ser. No. 13/927,680, filed Jun. 26, 2013; Ser. No. 13/916,051, filed Jun. 12, 2013; Ser. No. 13/894,870, filed May 15, 2013; Ser. No. 13/887,724, filed May 6, 2013; Ser. No. 13/852,190, filed Mar. 28, 2013; Ser. No. 13/851,378, filed Mar. 27, 2013; Ser. No. 13/848,796, filed Mar. 22, 2012; Ser. No. 13/847,815, filed Mar. 20, 2013; Ser. No. 13/800,697, filed Mar. 13, 2013; Ser. No. 13/785,099, filed Mar. 5, 2013; Ser. No. 13/779,881, filed Feb. 28, 2013; Ser. No. 13/774,317, filed Feb. 22, 2013; Ser. No. 13/774,315, filed Feb. 22, 2013; Ser. No. 13/681,963, filed Nov. 20, 2012; Ser. No. 13/660,306, filed Oct. 25, 2012; Ser. No. 13/653,577, filed Oct. 17, 2012; and/or Ser. No. 13/534,657, filed Jun. 27, 2012, and/or U.S. provisional application Ser. No. 61/895,610, filed Oct. 25, 2013; Ser. No. 61/895,609, filed Oct. 25, 2013; Ser. No. 61/893,489, filed Oct. 21, 2013; Ser. No. 61/886,883, filed Oct. 4, 2013; Ser. No. 61/879,837, filed Sep. 19, 2013; Ser. No. 61/879,835, filed Sep. 19, 2013; Ser. No. 61/878,877, filed Sep. 17, 2013; Ser. No. 61/875,351, filed Sep. 9, 2013; Ser. No. 61/869,195, filed. Aug. 23, 2013; Ser. No. 61/864,835, filed Aug. 12, 2013; Ser. No. 61/864,836, filed Aug. 12, 2013; Ser. No. 61/864,837, filed Aug. 12, 2013; Ser. No. 61/864,838, filed Aug. 12, 2013; Ser. No. 61/856,843, filed Jul. 22, 2013, Ser. No. 61/845,061, filed Jul. 11, 2013; Ser. No. 61/844,630, filed Jul. 10, 2013; Ser. No. 61/844,173, filed Jul. 9, 2013; Ser. No. 61/844,171, filed Jul. 9, 2013; Ser. No. 61/842,644, filed Jul. 3, 2013; Ser. No. 61/840,542, filed Jun. 28, 2013; Ser. No. 61/838,619, filed Jun. 24, 2013; Ser. No. 61/838,621, filed Jun. 24, 2013; Ser. No. 61/837,955, filed Jun. 21, 2013; Ser. No. 61/836,900, filed Jun. 19, 2013; Ser. No. 61/836,380, filed Jun. 18, 2013; Ser. No. 61/834,129, filed Jun. 12, 2013; Ser. No. 61/833,080, filed Jun. 10, 2013; Ser. No. 61/830,375, filed Jun. 3, 2013; Ser. No. 61/830,377, filed Jun. 3, 2013; Ser. No. 61/825,752, filed May 21, 2013; Ser. No. 61/825,753, filed May 21, 2013; Ser. No. 61/823,648, filed May 15, 2013; Ser. No. 61/823,644, filed May 15, 2013; Ser. No. 61/821,922, filed May 10, 2013; Ser. No. 61/819,835, filed May 6, 2013; Ser. No. 61/819,033, filed May 3, 2013; Ser. No. 61/816,956, filed Apr. 29, 2013; Ser. No. 61/815,044, filed Apr. 23, 2013; Ser. No. 61/814,533, filed Apr. 22, 2013; Ser. No. 61/813,361, filed Apr. 18, 2013; Ser. No. 61/810,407, filed Apr. 10, 2013; Ser. No. 61/808,930, filed Apr. 5, 2013; Ser. No. 61/807,050, filed Apr. 1, 2013; Ser. No. 61/806,674, filed Mar. 29, 2013; Ser. No. 61/793,592, filed Mar. 15, 2013; Ser. No. 61/772,015, filed Mar. 4, 2013; Ser. No. 61/772,014, filed Mar. 4, 2013; Ser. No. 61/770,051, filed Feb. 27, 2013; Ser. No. 61/770,048, filed Feb. 27, 2013; Ser. No. 61/766,883, filed Feb. 20, 2013; Ser. No. 61/760,366, filed Feb. 4, 2013; Ser. No. 61/760,364, filed Feb. 4, 2013; Ser. No. 61/756,832, filed Jan. 25, 2013; Ser. No. 61/754,804, filed Jan. 21, 2013; Ser. No. 61/736,104, filed Dec. 12, 2012; Ser. No. 61/736,103, filed Dec. 12, 2012; Ser. No. 61/734,457, filed Dec. 7, 2012; Ser. No. 61/733,598, filed Dec. 5, 2012; Ser. No. 61/733,093, filed Dec. 4, 2012; Ser. No. 61/727,912, filed Nov. 19, 2012; and/or Ser. No. 61/727,910, filed Nov. 19, 2012, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. patent application Ser. No. 13/202,005, filed Aug. 17, 2011, which are hereby incorporated herein by reference in their entireties.

The imaging device and control and image processor and any associated illumination source, if applicable, may comprise any suitable components, and may utilize aspects of the cameras and vision systems described in U.S. Pat. Nos. 5,550,677; 5,877,897; 6,498,620; 5,670,935; 5,796,094; 6,396,397; 6,806,452; 6,690,268; 7,005,974; 7,123,168; 7,004,606; 6,946,978; 7,038,577; 6,353,392; 6,320,176; 6,313,454; and 6,824,281, and/or International Publication No. WO 2010/099416, published Sep. 2, 2010, and/or PCT Application No. PCT/US10/47256, filed Aug. 31, 2010 and published Mar. 10, 2011 as International Publication No. WO 2011/028686, and/or U.S. patent application Ser. No. 12/508,840, filed Jul. 24, 2009, and published Jan. 28, 2010 as U.S. Pat. Publication No. US 2010-0020170, and/or PCT Application No. PCT/US2012/048110, filed Jul. 25, 2012, and/or U.S. patent application Ser. No. 13/534,657, filed Jun. 27, 2012, which are all hereby incorporated herein by reference in their entireties. The camera or cameras may comprise any suitable cameras or imaging sensors or camera modules, and may utilize aspects of the cameras or sensors described in U.S. patent application Ser. No. 12/091,359, filed Apr. 24, 2008 and published Oct. 1, 2009 as U.S. Publication No. US-2009-0244361, and/or Ser. No. 13/260,400, filed Sep. 26, 2011, and/or U.S. Pat. Nos. 7,965,336 and/or 7,480,149, which are hereby incorporated herein by reference in their entireties. The imaging array sensor may comprise any suitable sensor, and may utilize various imaging sensors or imaging array sensors or cameras or the like, such as a CMOS imaging array sensor, a CCD sensor or other sensors or the like, such as the types described in U.S. Pat. Nos. 5,550,677; 5,670,935; 5,760,962; 5,715,093; 5,877,897; 6,922,292; 6,757,109; 6,717,610; 6,590,719; 6,201,642; 6,498,620; 5,796,094; 6,097,023; 6,320,176; 6,559,435; 6,831,261; 6,806,452; 6,396,397; 6,822,563; 6,946,978; 7,339,149; 7,038,577; 7,004,606; and/or 7,720,580, and/or U.S. patent application Ser. No. 10/534,632, filed May 11, 2005, now U.S. Pat. No. 7,965,336; and/or PCT Application No. PCT/US2008/076022, filed Sep. 11, 2008 and published Mar. 19, 2009 as International Publication No. WO/2009/036176, and/or PCT Application No. PCT/US2008/078700, filed Oct. 3, 2008 and published Apr. 9, 2009 as International Publication No. WO/2009/046268, which are all hereby incorporated herein by reference in their entireties.

The camera module and circuit chip or board and imaging sensor may be implemented and operated in connection with various vehicular vision-based systems, and/or may be operable utilizing the principles of such other vehicular systems, such as a vehicle headlamp control system, such as the type disclosed in U.S. Pat. Nos. 5,796,094; 6,097,023; 6,320,176; 6,559,435; 6,831,261; 7,004,606; 7,339,149; and/or 7,526,103, which are all hereby incorporated herein by reference in their entireties, a rain sensor, such as the types disclosed in commonly assigned U.S. Pat. Nos. 6,353,392; 6,313,454; 6,320,176; and/or 7,480,149, which are hereby incorporated herein by reference in their entireties, a vehicle vision system, such as a forwardly, sidewardly or rearwardly directed vehicle vision system utilizing principles disclosed in U.S. Pat. Nos. 5,550,677; 5,670,935; 5,760,962; 5,877,897; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; and/or 7,859,565, which are all hereby incorporated herein by reference in their entireties, a trailer hitching aid or tow check system, such as the type disclosed in U.S. Pat. No. 7,005,974, which is hereby incorporated herein by reference in its entirety, a reverse or sideward imaging system, such as for a lane change assistance system or lane departure warning system or for a blind spot or object detection system, such as imaging or detection systems of the types disclosed in U.S. Pat. Nos. 7,720,580; 7,038,577; 5,929,786 and/or 5,786,772, and/or U.S. patent application Ser. No. 11/239,980, filed Sep. 30, 2005, now U.S. Pat. No. 7,881,496, and/or U.S. provisional applications, Ser. No. 60/628,709, filed Nov. 17, 2004; Ser. No. 60/614,644, filed Sep. 30, 2004; Ser. No. 60/618,686, filed Oct. 14, 2004; Ser. No. 60/638,687, filed Dec. 23, 2004, which are hereby incorporated herein by reference in their entireties, a video device for internal cabin surveillance and/or video telephone function, such as disclosed in U.S. Pat. Nos. 5,760,962; 5,877,897; 6,690,268; and/or 7,370,983, and/or U.S. patent application Ser. No. 10/538,724, filed Jun. 13, 2005 and published Mar. 9, 2006 as U.S. Publication No. US-2006-0050018, which are hereby incorporated herein by reference in their entireties, a traffic sign recognition system, a system for determining a distance to a leading or trailing vehicle or object, such as a system utilizing the principles disclosed in U.S. Pat. Nos. 6,396,397 and/or 7,123,168, which are hereby incorporated herein by reference in their entireties, and/or the like.

Optionally, the circuit board or chip may include circuitry for the imaging array sensor and or other electronic accessories or features, such as by utilizing compass-on-a-chip or EC driver-on-a-chip technology and aspects such as described in U.S. Pat. No. 7,255,451 and/or U.S. Pat. No. 7,480,149; and/or U.S. patent application Ser. No. 11/226,628, filed Sep. 14, 2005 and published Mar. 23, 2006 as U.S. Publication No. US-2006-0061008, and/or Ser. No. 12/578,732, filed Oct. 14, 2009, which are hereby incorporated herein by reference in their entireties.

Optionally, the vision system may include a display for displaying images captured by one or more of the imaging sensors for viewing by the driver of the vehicle while the driver is normally operating the vehicle. Optionally, for example, the vision system may include a video display device disposed at or in the interior rearview mirror assembly of the vehicle, such as by utilizing aspects of the video mirror display systems described in U.S. Pat. No. 6,690,268 and/or U.S. patent application Ser. No. 13/333,337, filed Dec. 21, 2011, which are hereby incorporated herein by reference in their entireties. The video mirror display may comprise any suitable devices and systems and optionally may utilize aspects of the compass display systems described in U.S. Pat. Nos. 7,370,983; 7,329,013; 7,308,341; 7,289,037; 7,249,860; 7,004,593; 4,546,551; 5,699,044; 4,953,305; 5,576,687; 5,632,092; 5,677,851; 5,708,410; 5,737,226; 5,802,727;

5,878,370; 6,087,953; 6,173,508; 6,222,460; 6,513,252; and/or 6,642,851, and/or European patent application, published Oct. 11, 2000 under Publication No. EP 0 1043566, and/or U.S. patent application Ser. No. 11/226,628, filed Sep. 14, 2005 and published Mar. 23, 2006 as U.S. Publication No. US-2006-0061008, which are all hereby incorporated herein by reference in their entireties. Optionally, the video mirror display screen or device may be operable to display images captured by a rearward viewing camera of the vehicle during a reversing maneuver of the vehicle (such as responsive to the vehicle gear actuator being placed in a reverse gear position or the like) to assist the driver in backing up the vehicle, and optionally may be operable to display the compass heading or directional heading character or icon when the vehicle is not undertaking a reversing maneuver, such as when the vehicle is being driven in a forward direction along a road (such as by utilizing aspects of the display system described in PCT Application No. PCT/US2011/056295, filed Oct. 14, 2011 and published Apr. 19, 2012 as International Publication No. WO 2012/051500, which is hereby incorporated herein by reference in its entirety).

Optionally, the vision system (utilizing the forward facing camera and a rearward facing camera and other cameras disposed at the vehicle with exterior fields of view) may be part of or may provide a display of a top-down view or birds-eye view system of the vehicle or a surround view at the vehicle, such as by utilizing aspects of the vision systems described in PCT Application No. PCT/US10/25545, filed Feb. 26, 2010 and published on Sep. 2, 2010 as International Publication No. WO 2010/099416, and/or PCT Application No. PCT/US10/47256, filed Aug. 31, 2010 and published Mar. 10, 2011 as International Publication No. WO 2011/028686, and/or PCT Application No. PCT/US2011/062834, filed Dec. 1, 2011 and published Jun. 7, 2012 as International Publication No. WO2012/075250, and/or PCT Application No. PCT/US2012/048993, filed Jul. 31, 2012, and/or PCT Application No. PCT/US11/62755, filed Dec. 1, 2011 and published Jun. 7, 2012 as International Publication No. WO 2012-075250, and/or PCT Application No. PCT/CA2012/000378, filed Apr. 25, 2012, and/or U.S. patent application Ser. No. 13/333,337, filed Dec. 21, 2011, and/or U.S. provisional applications, Ser. No. 61/615,410, filed Mar. 26, 2012; Ser. No. 61/588,833, filed Jan. 20, 2012; Ser. No. 61/570,017, filed Dec. 13, 2011; and/or Ser. No. 61/568,791, filed Dec. 9, 2011, which are hereby incorporated herein by reference in their entireties.

Optionally, a video mirror display may be disposed rearward of and behind the reflective element assembly and may comprise a display such as the types disclosed in U.S. Pat. Nos. 5,530,240; 6,329,925; 7,855,755; 7,626,749; 7,581,859; 7,446,650; 7,370,983; 7,338,177; 7,274,501; 7,255,451; 7,195,381; 7,184,190; 5,668,663; 5,724,187 and/or 6,690,268, and/or in U.S. patent application Ser. No. 12/091,525, filed Apr. 25, 2008, now U.S. Pat. No. 7,855,755; Ser. No. 11/226,628, filed Sep. 14, 2005 and published Mar. 23, 2006 as U.S. Publication No. US-2006-0061008; and/or Ser. No. 10/538,724, filed Jun. 13, 2005 and published Mar. 9, 2006 as U.S. Publication No. US-2006-0050018, which are all hereby incorporated herein by reference in their entireties. The display is viewable through the reflective element when the display is activated to display information. The display element may be any type of display element, such as a vacuum fluorescent (VF) display element, a light emitting diode (LED) display element, such as an organic light emitting diode (OLED) or an inorganic light emitting diode, an electroluminescent (EL) display element, a liquid crystal display (LCD) element, a video screen display element or backlit thin film transistor (TFT) display element or the like, and may be operable to display various information (as discrete characters, icons or the like, or in a multi-pixel manner) to the driver of the vehicle, such as passenger side inflatable restraint (PSIR) information, tire pressure status, and/or the like. The mirror assembly and/or display may utilize aspects described in U.S. Pat. Nos. 7,184,190; 7,255,451; 7,446,924 and/or 7,338,177, which are all hereby incorporated herein by reference in their entireties. The thicknesses and materials of the coatings on the substrates of the reflective element may be selected to provide a desired color or tint to the mirror reflective element, such as a blue colored reflector, such as is known in the art and such as described in U.S. Pat. Nos. 5,910,854; 6,420,036; and/or 7,274,501, which are hereby incorporated herein by reference in their entireties.

Optionally, the display or displays and any associated user inputs may be associated with various accessories or systems, such as, for example, a tire pressure monitoring system or a passenger air bag status or a garage door opening system or a telematics system or any other accessory or system of the mirror assembly or of the vehicle or of an accessory module or console of the vehicle, such as an accessory module or console of the types described in U.S. Pat. Nos. 7,289,037; 6,877,888; 6,824,281; 6,690,268; 6,672,744; 6,386,742; and 6,124,886, and/or U.S. patent application Ser. No. 10/538,724, filed Jun. 13, 2005 and published Mar. 9, 2006 as U.S. Publication No. US-2006-0050018, which are hereby incorporated herein by reference in their entireties.

While the above description constitutes a plurality of embodiments of the present invention, it will be appreciated that the present invention is susceptible to further modification and change without departing from the fair meaning of the accompanying claims.

The invention claimed is:

1. A circuit board for a surface mount device to be attached thereto, wherein said circuit board is for an image processing chip of a vision system of a vehicle, said circuit board comprising:

at least one mounting location having a plurality of solder pads established thereat, said solder pads corresponding to a plurality of solder points of an image processing chip;

wherein said solder pads are arranged and shaped in a manner that enhances soldering of the image processing chip to said solder pads and circuit board;

wherein said solder pads each comprise an elongated solder pad having a longitudinal axis, and wherein said solder pads are arranged such that the longitudinal axes of some of said solder pads are generally orthogonal to the longitudinal axes of others of said solder pads;

wherein said mounting location comprises first, second, third and fourth quadrants with each of said first, second, third and fourth quadrants comprising a respective corner region of said mounting location;

wherein said solder pads of said first quadrant of said mounting location are generally orthogonal to said solder pads of said second quadrant of said mounting location;

wherein said solder pads of said first quadrant are generally parallel to said solder pads of said third quadrant of said mounting location and wherein said solder pads of said second quadrant are generally parallel to said solder pads of said fourth quadrant of said mounting location; and wherein said first and third quadrants are at opposite corner regions of said mounting location and wherein said second and fourth quadrants are at opposite corner regions of said mounting location.

2. The circuit board of claim 1, wherein said solder pads are arranged similarly in respective portions of said mounting location.

3. The circuit board of claim 2, wherein said solder pads of one portion of said mounting location are generally parallel to one another at the one portion and are generally orthogonal to said solder pads of another portion of said mounting location.

4. The circuit board of claim 1, wherein said solder pads are generally tear-drop shaped.

5. The circuit board of claim 4, wherein said tear-drop shaped solder pads are arranged so as to point generally towards or generally away from a center area of said mounting location of said circuit board.

6. The circuit board of claim 1, wherein said solder pads each comprise a narrower end and a wider end, and wherein said solder pads are arranged so as to point generally towards a center area of said mounting location of said circuit board.

7. The circuit board of claim 1, wherein said solder pads each comprise a narrower end and a wider end, and wherein said solder pads are arranged so as to point generally away from a center area of said mounting location of said circuit board.

8. The circuit board of claim 1, wherein each of said first, second, third and fourth quadrants comprise approximately one quarter of said mounting location.

9. The circuit board of claim 8, wherein (i) said solder pads of said first quadrant are disposed along a first border region of said first quadrant that is along a first border region of said second quadrant and are disposed along a second border region of said first quadrant that is along a first border region of said fourth quadrant, (ii) said solder pads of said second quadrant are disposed along said first border region of said second quadrant and are disposed along a second border region of said second quadrant that is along a first border region of said third quadrant, (iii) said solder pads of said third quadrant are disposed along said first border region of said third quadrant and are disposed along a second border region of said third quadrant that is along a second border region of said fourth quadrant, and (iv) said solder pads of said fourth quadrant are disposed along said first border region of said fourth quadrant and are disposed along said second border region of said fourth quadrant.

10. The circuit board of claim 1, wherein said solder pads are disposed as rows and columns of solder pads at each of the respective quadrants.

11. A circuit board for a surface mount device to be attached thereto, wherein said circuit board is for an image processing chip of a vision system of a vehicle, said circuit board comprising:
at least one mounting location having a plurality of solder pads established thereat, said solder pads corresponding to a plurality of solder points of an image processing chip;
wherein said solder pads are arranged similarly in respective quadrants of said mounting location;
wherein said solder pads each comprise an elongated solder pad having a longitudinal axis, and wherein said solder pads are arranged and shaped such that the longitudinal axes of some of said solder pads are generally orthogonal to the longitudinal axes of others of said solder pads;
wherein said mounting location comprises first, second, third and fourth quadrants with each of said first, second, third and fourth quadrants comprising a respective corner region of said mounting location;
wherein said solder pads of said first quadrant of said mounting location are generally orthogonal to said solder pads of said second quadrant of said mounting location;
wherein said solder pads of said first quadrant are generally parallel to said solder pads of said third quadrant of said mounting location and wherein said solder pads of said second quadrant are generally parallel to said solder pads of said fourth quadrant of said mounting location; and
wherein said first and third quadrants are at opposite corner regions of said mounting location and wherein said second and fourth quadrants are at opposite corner regions of said mounting location.

12. The circuit board of claim 11, wherein said solder pads are generally tear-drop shaped.

13. The circuit board of claim 12, wherein said tear-drop shaped solder pads are arranged so as to point generally towards or generally away from a center area of said mounting location of said circuit board.

14. The circuit board of claim 11, wherein said solder pads each comprise a narrower end and a wider end, and wherein said solder pads are arranged so as to point generally towards a center area of said mounting location of said circuit board.

15. The circuit board of claim 11, wherein said solder pads each comprise a narrower end and a wider end, and wherein said solder pads are arranged so as to point generally away from a center area of said mounting location of said circuit board.

16. The circuit board of claim 11, wherein said solder pads are disposed as rows and columns of solder pads at each of the respective quadrants.

17. A circuit board for a surface mount device to be attached thereto, wherein said circuit board is for an image processing chip of a vision system of a vehicle, said circuit board comprising:
at least one mounting location having a plurality of solder pads established thereat, said solder pads corresponding to a plurality of solder points of an image processing chip;
wherein said solder pads are generally tear-drop shaped and wherein said teardrop-shaped solder pads each have a longitudinal axis, and wherein said teardrop-shaped solder pads are arranged such that the longitudinal axes of some of said teardrop-shaped solder pads are generally orthogonal to the longitudinal axes of others of said solder pads;
wherein said mounting location comprises first, second, third and fourth quadrants with each of said first, second, third and fourth quadrants comprising a respective corner region of said mounting location;
wherein said teardrop-shaped solder pads of said first quadrant of said mounting location are generally orthogonal to said teardrop-shaped solder pads of said second quadrant of said mounting location, and wherein said teardrop-shaped solder pads of said first quadrant are generally parallel to said teardrop-shaped solder pads of said third quadrant of said mounting location and said teardrop-shaped solder pads of said second quadrant are generally parallel to said teardrop-shaped solder pads of said fourth quadrant of said mounting location.

18. The circuit board of claim 17, wherein said teardrop-shaped solder pads are arranged as rows and columns of solder pads at each of the respective quadrants.

19. The circuit board of claim 17, wherein said teardrop-shaped solder pads each comprise a narrower end and a wider end, and wherein said solder pads are arranged so as to point generally towards a center area of said mounting location of said circuit board.

20. The circuit board of claim 17, wherein said teardrop-shaped solder pads each comprise a narrower end and a wider end, and wherein said solder pads are arranged so as to point generally away from a center area of said mounting location of said circuit board.

* * * * *